US011682584B2

(12) United States Patent
Ben Ezer

(10) Patent No.: US 11,682,584 B2
(45) Date of Patent: Jun. 20, 2023

(54) MEASURING BURIED LAYERS

(71) Applicant: CAMTEK Ltd., Migdal-Haemek (IL)

(72) Inventor: Zehava Ben Ezer, Balfuria (IL)

(73) Assignee: CAMTEK LTD., Migdal-Haemek (IL)

( * ) Notice: Subject to any disclaimer, the term of this patent is extended or adjusted under 35 U.S.C. 154(b) by 0 days.

(21) Appl. No.: 16/726,292

(22) Filed: Dec. 24, 2019

(65) Prior Publication Data

US 2020/0279775 A1     Sep. 3, 2020

Related U.S. Application Data

(60) Provisional application No. 62/784,838, filed on Dec. 26, 2018.

(51) Int. Cl.
| | |
|---|---|
| *H01L 21/768* | (2006.01) |
| *H01L 23/488* | (2006.01) |
| *H01L 21/22* | (2006.01) |
| *H01L 21/66* | (2006.01) |

(52) U.S. Cl.
CPC ........ *H01L 21/76898* (2013.01); *H01L 21/22* (2013.01); *H01L 22/12* (2013.01); *H01L 22/24* (2013.01); *H01L 23/488* (2013.01)

(58) Field of Classification Search
None
See application file for complete search history.

(56) References Cited

U.S. PATENT DOCUMENTS

| | | | |
|---|---|---|---|
| 7,027,158 B2* | 4/2006 | Hendrix | G01N 21/55 356/369 |
| 7,223,981 B1* | 5/2007 | Capote | H01L 31/0296 257/E31.016 |
| 10,079,218 B1* | 9/2018 | Lin | H01L 22/20 |
| 2012/0038921 A1* | 2/2012 | Ben-Ezer | G01N 21/8806 356/369 |
| 2017/0150104 A1* | 5/2017 | Koren | G06T 1/0007 |
| 2017/0344697 A1* | 11/2017 | Postolov | G03F 7/70616 |

* cited by examiner

*Primary Examiner* — Alexander G Ghyka
(74) *Attorney, Agent, or Firm* — Reches Patents

(57) ABSTRACT

There may be provided a method for inspecting a top redistribution layer conductors of an object. The top redistribution layer (RDL) is positioned above at least one lower RDL and above at least one other dielectric layer. The method may include (i) illuminating the object with radiation, the at least one lower dielectric layer significantly absorbs the radiation; (ii) generating, by a detector, detection signals that represent radiation reflected from the object, and (iii) processing, by a processor, the detection signal to provide information about the top RDL. The processing may include distinguishing detection signals related to the top RDL from detection signals related to the at least one lower RDL.

20 Claims, 6 Drawing Sheets

```
┌─────────────────────────────────────────────────────────────────────────┐
│ Determining a spectral range of the ultraviolet radiation based on at   │
│ least one absorption property of at least one dielectric layer of the   │
│ object. 310                                                             │
└─────────────────────────────────────────────────────────────────────────┘
                                      │
                                      ▼
┌─────────────────────────────────────────────────────────────────────────┐
│ Illuminating the object with ultraviolet radiation. The top             │
│ redistribution layer (RDL) is (a) covered by a top dielectric layer,    │
│ and (b) is positioned above at least one lower RDL and above at least   │
│ one other dielectric layer 320                                          │
└─────────────────────────────────────────────────────────────────────────┘
                                      │
                                      ▼
┌─────────────────────────────────────────────────────────────────────────┐
│ Generating, by a detector, detection signals ultraviolet radiation      │
│ emitted from the object 330                                             │
└─────────────────────────────────────────────────────────────────────────┘
                                      │
                                      ▼
┌─────────────────────────────────────────────────────────────────────────┐
│ Processing, by a processor, the detection signal to provide information │
│ about the top RDL 340                                                   │
└─────────────────────────────────────────────────────────────────────────┘
```

MEASURING BURIED LAYERS

BACKGROUND OF THE INVENTION

A redistribution layer (RDL) includes wiring that are used to electrically couple different conductors of different location. RDLs are used to bond chips to each other in various packaging technologies such wafer level chip scale packaging, WLFO—wafer level fan-out, and wafer level fan-in.

Different RDLs are separated in between by dielectric polymer layers (polyimide, PBO, etc.).

Defect detection is required for detection of Layer defects—such as cut, shorts and other distortions.

Each RDL should be inspected separately. While inspecting a current RDL, other RDLs located at other depts are also seen in the image, since the polymers are mostly transparent in visible spectral range.

It is hard to distinguish between the different RDLs and to avoid false calls of defects.

SUMMARY

There may be provided a method for inspecting a top redistribution layer conductors of an object, the method may include (i) illuminating the object with radiation; wherein the top RDL is positioned above at least one lower RDL and above at least one lower dielectric layer; wherein the at least one lower dielectric layer significantly absorbs the radiation; (ii) generating, by a detector, detection signals that represent radiation reflected from the object; and (iii) processing, by a processor, the detection signal to provide information about the top RDL; wherein the processing comprises distinguishing detection signals related to the top RDL from detection signals related to the at least one lower RDL.

The distinguishing may be based on a strength of the detection signals and wherein the detection signals related to the top RDL are stronger than the detection signals related to the at least one lower RDL.

The method may include selecting a spectral range of the radiation based on at least one absorption property of at least one dielectric layer of the object.

The at least one absorption property may be an absorption spectrum of a dielectric material that forms at least one of the dielectric layers of the object.

The at least one absorption property may be a thickness of at least one of the dielectric layers of the object.

The at least one absorption property may be (a) an absorption spectrum of a dielectric material that forms at least one of the dielectric layers of the object, and (b) a thickness of at least one of the dielectric layers of the object.

The determining may be based on testing the object with radiation of different spectral ranges and selecting a selected spectral range of the different spectral ranges.

The determining may be based on estimating reflected radiation to be reflected from the object when illuminated with radiation of different spectral ranges and selecting a selected spectral range of the different spectral ranges.

The determining may include selecting a filtering property of a filter located between a radiation source and the object.

The determining may include selecting a source out of multiple sources.

There may be provided a non-transitory computer readable medium that stores instructions for: (i) illuminating the object with radiation; wherein the top RDL is positioned above at least one lower RDL and above at least one lower dielectric layer; wherein the at least one lower dielectric layer significantly absorbs the radiation;(ii) generating, by a detector, detection signals that represent radiation reflected from the object; and (iii) processing, by a processor, the detection signal to provide information about the top RDL; wherein the processing comprises distinguishing detection signals related to the top RDL from detection signals related to the at least one lower RDL.

The distinguishing may be based on a strength of the detection signals and wherein the detection signals related to the top RDL are stronger than the detection signals related to the at least one lower RDL.

The non-transitory computer readable medium that stores instructions for determining a spectral range of the radiation based on at least one absorption property of at least one dielectric layer of the object.

The at least one absorption property may be an absorption spectrum of a dielectric material that forms at least one of the dielectric layers of the object.

The at least one absorption property may be a thickness of at least one of the dielectric layers of the object.

The at least one absorption property may be (a) an absorption spectrum of a dielectric material that forms at least one of the dielectric layers of the object, and (b) a thickness of at least one of the dielectric layers of the object.

The determining may be based on testing the object with radiation of different spectral ranges and selecting a selected spectral range of the different spectral ranges.

The determining may be based on estimating reflected radiation to be reflected from the object when illuminated with radiation of different spectral ranges and selecting a selected spectral range of the different spectral ranges.

The determining may include selecting a filtering property of a filter located between a radiation source and the object.

The determining may include selecting a source out of multiple sources.

There may be provided a system for inspecting an object, the system may include: (i) an illumination module that may be configured to illuminate an object with radiation, wherein a top redistribution layer (RDL) of the object may be positioned above at least one lower RDL and above at least one other dielectric layer; (ii) a detector that is configured to generate detection signals representing radiation reflected from the object; wherein the detection signals related to the top RDL are stronger than the detection signals related to the at least one lower RDL; and a processor that is configured to process the detection signals to provide information about the top RDL. The processing may include distinguishing the detection signals related to the top RDL from the detection signals related to the at least one lower RDL.

The system may be configured to determine a spectral range of the radiation based on at least one absorption property of at least one dielectric layer of the object.

The distinguishing may be based on a strength of the detection signals and wherein the detection signals related to the top RDL are stronger than the detection signals related to the at least one lower RDL.

The system may be configured to determine a spectral range of the radiation based on at least one absorption property of at least one dielectric layer of the object.

The at least one absorption property may be an absorption spectrum of a dielectric material that forms at least one of the dielectric layers of the object.

The at least one absorption property may be a thickness of at least one of the dielectric layers of the object.

The at least one absorption property may be (a) an absorption spectrum of a dielectric material that forms at least one of the dielectric layers of the object, and (b) a thickness of at least one of the dielectric layers of the object.

The system may be configured to determine based on testing the object with radiation of different spectral ranges and selecting a selected spectral range of the different spectral ranges.

The system may be configured to determine based on estimated reflected radiation to be reflected from the object when illuminated with radiation of different spectral ranges and selecting a selected spectral range of the different spectral ranges.

The determining may include selecting a filtering property of a filter located between an radiation source and the object.

The determining may include selecting an source out of multiple sources.

BRIEF DESCRIPTION OF THE INVENTION

The present invention will be understood and appreciated more fully from the following detailed description taken in conjunction with the drawings in which:

FIG. 6 illustrates an example of a method.

DETAILED DESCRIPTION OF THE INVENTION

Figure 1:
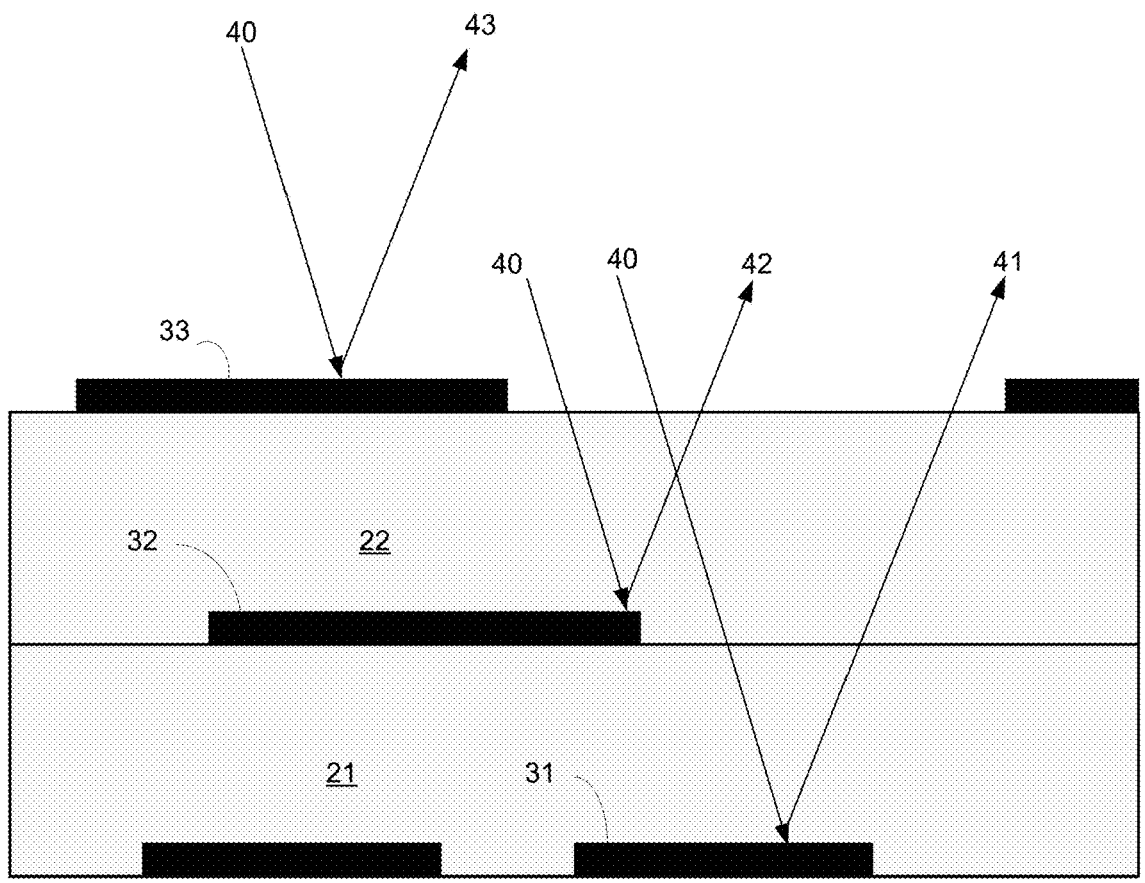
FIG. 1 illustrates an example of an object that is illuminated using visible light.

Because the apparatus implementing the present invention is, for the most part, composed of optical components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

The word "comprising" does not exclude the presence of other elements or steps then those listed in a claim. It is understood that the terms so used are interchangeable under appropriate circumstances such that the embodiments of the invention described herein are, for example, capable of operation in other orientations than those illustrated or otherwise described herein.

The terms "select" and "determine" are used in an interchangeable manner.

The term "configured to" may be "constructed and arranged to". Configured to may include being programmed, set to, tuned to, and the like.

The term "UV illumination" and "UV radiation" are used in an interchangeable manner.

There may be provided a method for inspecting a top redistribution layer conductors of an object, the method may include (i) illuminating the object with radiation; wherein the top RDL is positioned above at least one lower RDL and above at least one lower dielectric layer; wherein the at least one lower dielectric layer significantly absorbs the radiation; (ii) generating, by a detector, detection signals that represent radiation reflected from the object; and (iii) processing, by a processor, the detection signal to provide information about the top RDL; wherein the processing comprises distinguishing detection signals related to the top RDL from detection signals related to the at least one lower RDL.

The term significant may mean at least by an amount that allows to distinguish between signals related to the top RDL from detection signals related to the at least one lower RDL.

The term significant amount of absorption may be mean absorbing by at least 10%, 20%, 30%, 40%, 50%, 60%, 70%, and even more.

In the following examples the radiation used to illuminate the object is referred to as ultraviolet radiation. This ultraviolet radiation has a spectral range that will be significantly attenuated by the one or more dielectric objects. It should be noted that ultraviolet radiation is merely a non-limiting example of radiation and that the object may be illuminated with radiation that is not ultraviolet radiation (for example purple, some variants of blue)—that will be selected based on at least one absorption property of the dielectric layer.

It should also be noted that though some of the test refers to RDL and dielectric layers that the object may include additional layers—for example its bottom layer may be a silicon substrate or other layer that is not RDL and is not a dielectric layer.

There are provided a system, a non-transitory computer readable medium, and a method for defect inspection of RDLs separated by dielectric layers. The system may include imaging optics and illumination, where illumination spectrum is selected based on (for example to match or substantially match) at least one absorbing property of the dielectric layers.

Various types of dielectric layers exist, each type comprises specific optical properties according to its composition etc. In that view, the spectral absorption and transmittance of the dielectric material relate to these properties. A common characteristic is that they are photosensitive in the UV region, hence exhibit absorption in the UV spectral range. Although spectral distribution of the absorption may differ from type to type within the UV range and even outside the UV range.

Given a specific wafer or panel of RDLs and whether the above mentioned properties are known or not, a phase of selection and control of the optimal spectral range of radiation is required.

It should be noted that the selection of the spectral range of the radiation may be sub-optimal.

The optimization phase may include selection between different illumination sources, each having its specific spectral emittance (e.g. LEDs with various peak wavelength).

The optimization stage may also be done by filtration of light spectrum (e.g. broad band illumination source, such as Xenon arc lamp and various spectral filters).

The radiation illumination paths may be coaxial (bright field) and/or other elevation/azimuthal angles (dark field).

The system may include both visible and dielectric layer absorbed illumination optics (optics that is adapted to output radiation that will be significantly absorbed by at least one lower dielectric layer of the object) to be selected and/or combined per relevancy of improving current RDL contrast and appearance in the image.

The radiation that will be significantly absorbed by at least one lower dielectric layer of the object is also referred to as dielectric layer absorbed radiation.

FIG. 1 illustrates object 20 as including (from bottom to top) a first RDL 31, a first dielectric layer 21, a second RDL 32, a second dielectric layer 22, and a third RDL 33 (which is a top RDL).

FIG. 1 also illustrates an illumination of object 20 by visible light 40 and reflections 43, 42 and 42 of the visible light from the third RDL 33, second RDL 32 and first RDL respectively.

The first and second dielectric layers 21 and 22 are transparent to the visible light and the different reflections form an image in which the reflection 43 from the top RDL 33 cannot be distinguished from the reflections 41 and 42 from the lower RDLs—the first and second RDLs 31 and 32.

Figure 2:
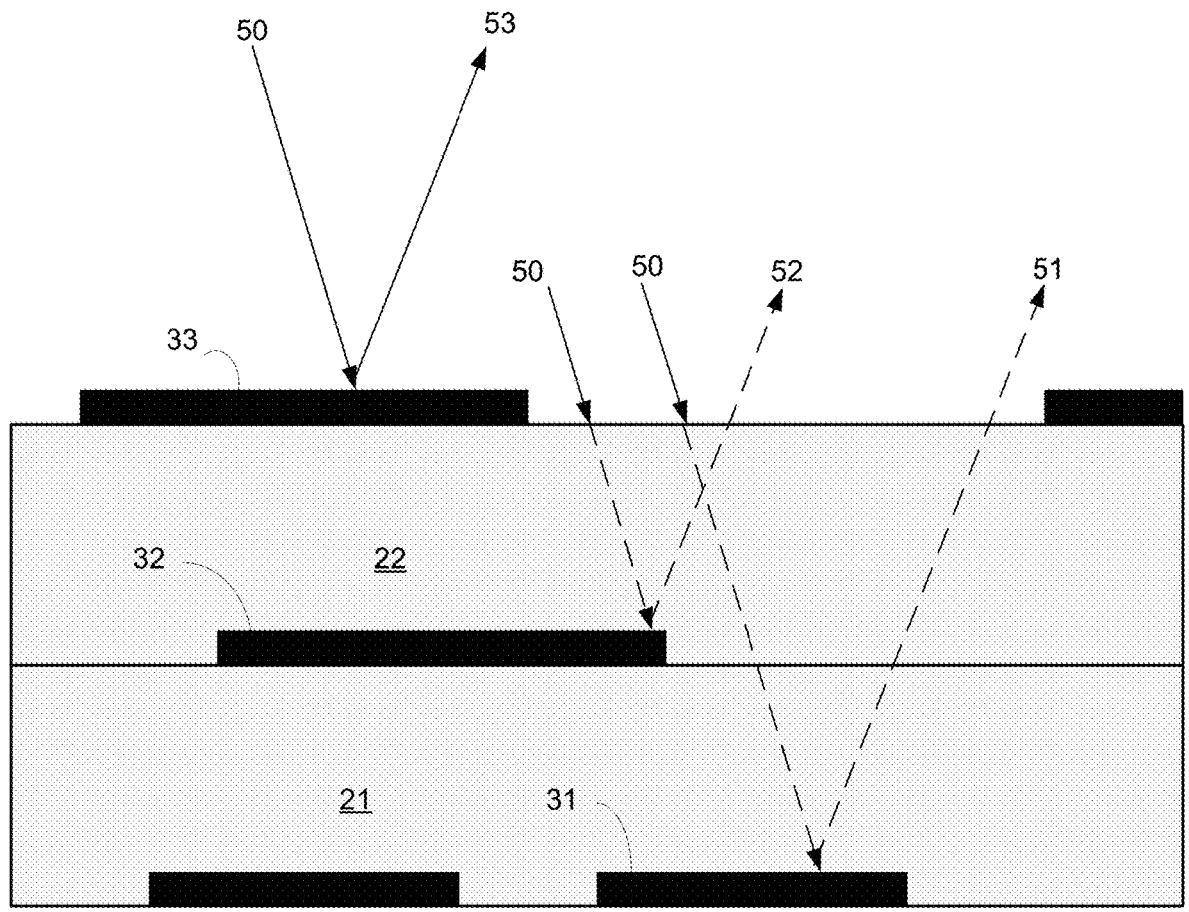
FIG. 2 illustrates an example of an object that is illuminated using ultra violet radiation.

FIG. 2 illustrates object 20 that is illuminated by dielectric layer absorbed 50, a refection 53 from the third RDL 33 and attenuated reflections 51 and 52 (due the attenuation of first and second dielectric layers 21 and 21) from the lower RDLs—the first and second RDLs 31 and 32.

If the spectral range of the dielectric layer absorbed radiation is properly selected—the first and second dielectric layers will absorb a high percentage of the dielectric layer absorbed radiation, and even if attenuated reflections exit object 20—they will be much weaker than reflection 53—due to the significant suppression—and will not be imaged or only vaguely imaged.

An optimization phase (of the dielectric layer absorbed radiation) is done to allow adequate contrast between reflections from the top RDL to reflections from lower RDLs.

Figure 3:
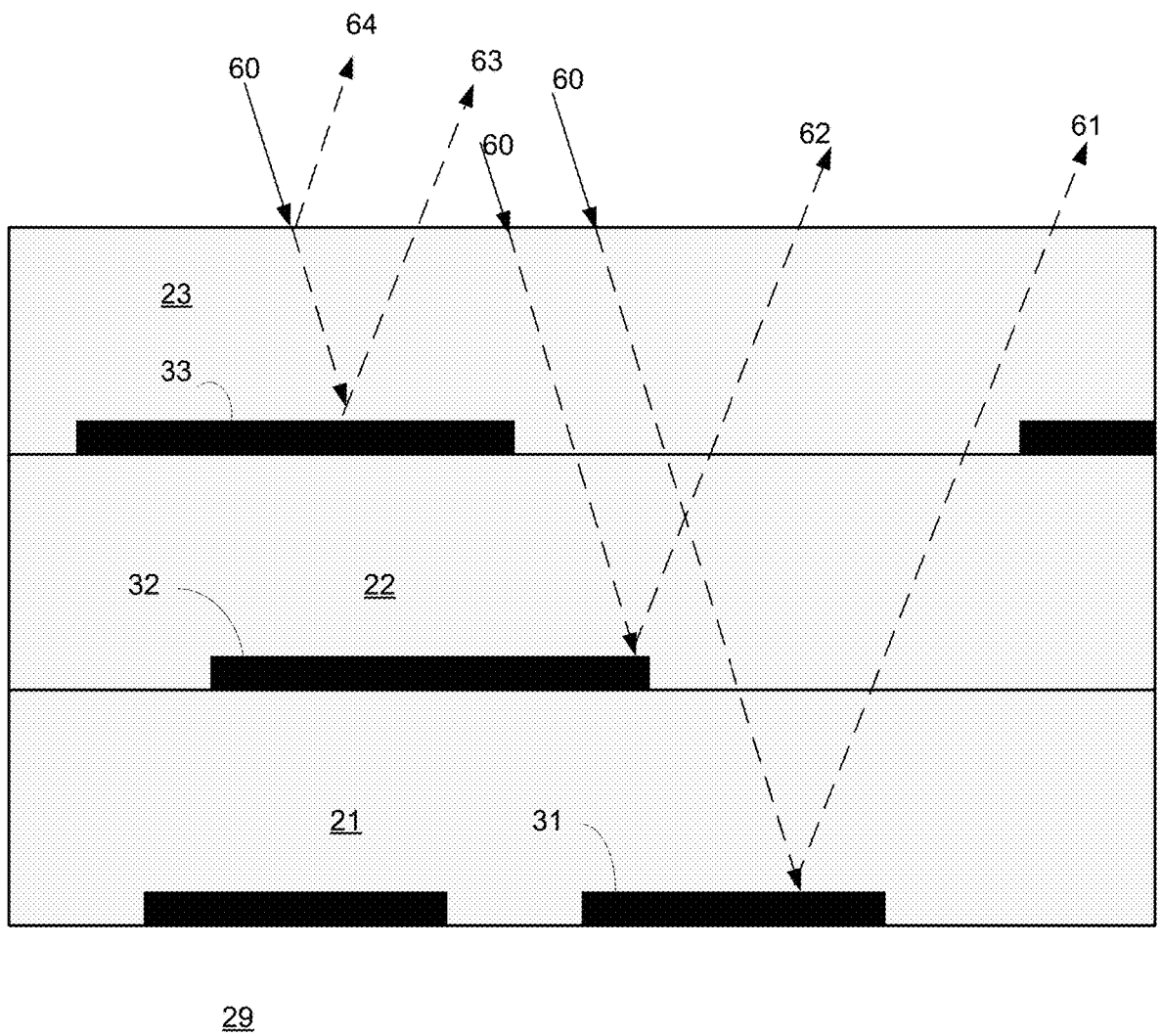
FIG. 3 illustrates an example of an object that is illuminated using ultra violet radiation.

FIG. 3 illustrates object 29 as including (from bottom to top) a first RDL 31, a first dielectric layer 21, a second RDL 32, a second dielectric layer 22, a third RDL 33 (which is a top RDL) and a third dielectric layer.

FIG. 3 illustrates object 29 that is illuminated by dielectric layer absorbed radiation 60, a refection 63 (having intensity I1) from the third RDL 33, a reflection 64 (having intensity 12) from the top surface of the third dielectric layer 23, attenuated reflections 61 (having intensity 14), and 62 (having intensity 13) from the lower RDLs—the first and second RDLs 31 and 32. The attenuation is applied by first, second, and third dielectric layers 21, 22 and 23.

Figure 4:
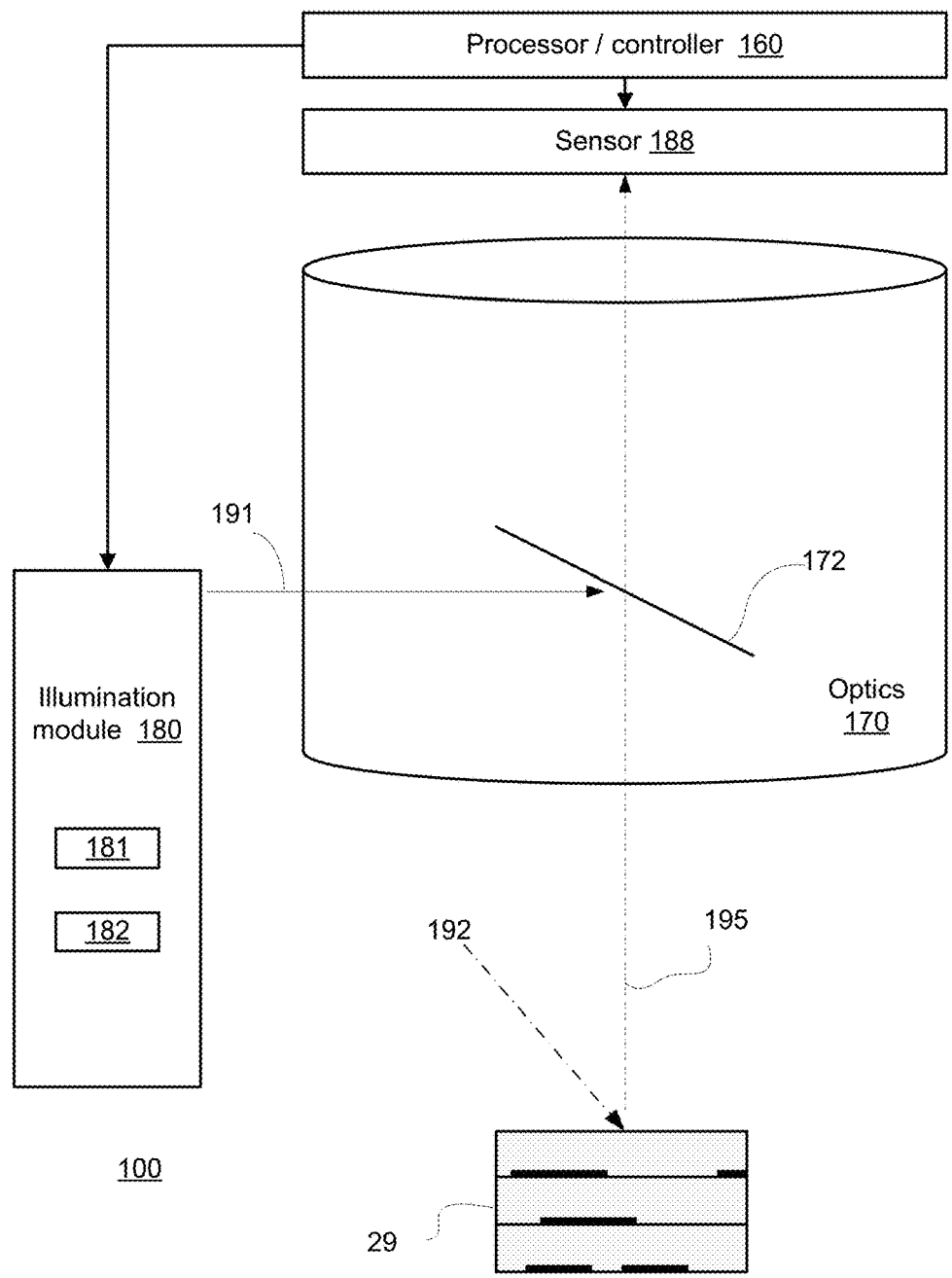
FIG. 4 illustrates an example of a system.

An example of a criteria for setting the dielectric layer absorbed radiation may include:
a. $I_1$ is above optical sensor sensitivity threshold
b. $I_1 \gg I_2$
c. $I_1 \gg I_3 > I_4$ FIG. 4 is an example of object 29 and of a system 100 for evaluating the object.

The system may include optics 170, illumination module 180, sensor 188 and a processor/controller 160.

The system 100 may illuminate the object 29 using dielectric layer absorbed radiation in bright field and/or dark field configuration—for example arrow 191 represents bright field illumination and arrow 192 illustrated dark field illumination. Reflected beam is denoted 195. The illumination and/or collection can be in any angle in relation to the optical 170 and/or to the object 29.

The optics 170 may include a beam splitter 172 or any other optical element.

Figure 5:
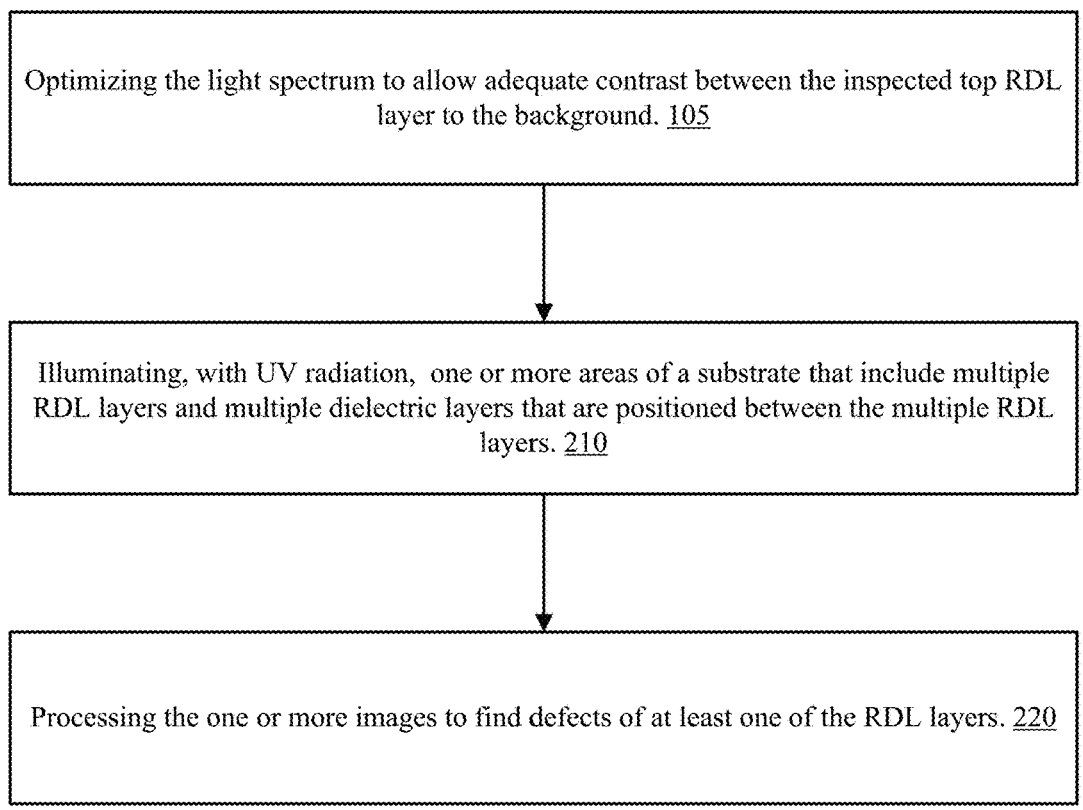
FIG. 5 illustrates an example of a method.

The illumination module 180 may include one or more radiation sources (including at least one dielectric layer absorbed radiation source), and/or may include one or more filters. In FIG. 5 there is a dielectric layer absorbed radiation source 181 and an adjustable filter 182.

The processor/controller 160 may be a processor, a controller or both. The processor may be separated from the controller. The processor/controller 160 may perform an evaluation of the object based on detection signals from sensor 188. The processor/controller 160 may control the operation of system and/or may select the desired dielectric layer absorbed radiation spectral range. The processor/controller may include one or more integrated circuits, and/or one or more processing circuits such as one or more graphic processing unit, one or more general purpose unit, one or more digital processing unit, a one or more field programmable gate array, and the like.

System 100 may be configured to execute any of the methods (for example methods 200 and 300) illustrated in the specification.

System 100 may optimize or otherwise select the spectral range of the radiation or may receive spectral range values from yet another system.

FIG. 5 is an example of method 200.

Method 200 may include steps 205, 210 and 220. Step 205 may include optimizing the light spectrum to allow adequate contrast between the inspected top RDL to the background. The light spectrum (spectral range) should be selected so that at least one lower dielectric layer (below the top RDL) significantly absorbs the radiation.

Step 210 may include illuminating, with radiation, one or more areas of a substrate that include multiple RDLs and multiple dielectric layers that are positioned between the multiple RDLs. Step 210 may also include acquiring one or more images of the one or more areas.

Step 220 may include processing the one or more images to find defects of at least one of the RDL.

The processing may involve applying any defect detection and/or measurement process such as comparison to a golden reference, comparison to design information, comparison between RDL conductors of another wafer or PCB, and the like.

FIG. 6 is an example of method 300.

Method 300 may start by step 310 of determining a spectral range of the radiation based on at least one absorption property of at least one dielectric layer of the object.

The light spectrum (spectral range) should be selected so that at least one lower dielectric layer (below the top RDL) significantly absorbs the radiation.

Step 310 may include determining a spectral range of the radiation based on at least one absorption property of at least one dielectric layer of the object.

The at least one absorption property may be an absorption spectrum of a dielectric material that forms at least one of the dielectric layers of the object. Thus—the radiation spectrum should fall on frequencies when the dielectric material attenuates the radiation.

The at least one absorption property may be a thickness of at least one of the dielectric layers of the object. Thicker dielectric layers of the same materials provide larger attenuation.

The determining may be based on at least one out of (a) known or estimated at least one absorption properties of the dielectric layers, or (a) results of testing the object (or a similar object) with radiation of different spectral ranges and determining a selected spectral range of the different spectral ranges.

The determining may be based on estimating reflected radiation to be reflected from the object when illuminated with radiation of different spectral ranges and determining a selected spectral range of the different spectral ranges.

The determining may include selecting a filtering property of a filter located between a radiation source and the object.

The determining may include selecting a radiation source out of multiple sources.

Step 310 may be followed by step 320 of illuminating the object with radiation. The top redistribution layer (RDL) is positioned above at least one lower RDL and above at least one other dielectric layer.

The light spectrum (spectral range) of the radiation should be selected so that at least one lower dielectric layer (below the top RDL) significantly absorbs the radiation Step 320 may be followed by step 330 of generating, by a detector, detection signals radiation emitted from the object. The detection signals may form one or more image or may form non-image information.

Step 330 may be followed by step 340 of processing, by a processor, the detection signal to provide information about the top RDL.

The processing may involve applying any defect detection and/or measurement process such as comparison to a golden reference, comparison to design information, comparison between RDL conductors of another wafer or PCB, and the like.

The processing may include distinguishing detection signals related to the top RDL from detection signals related to the at least one lower RDL.

The distinguishing may be based on a strength of the detection signals. The detection signals related to the top RDL are stronger than the detection signals related to the at least one lower RDL. Related to means detection signals from reflected from top RDL conductors.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe.

Thus, these terms are not necessarily intended to indicate temporal or other prioritization of such elements. The mere fact that certain measures are recited in mutually different claims does not indicate that a combination of these measures cannot be used to advantage.

We claim:

1. A method for inspecting a top redistribution layer (RDL) of an object, the method comprises:
   illuminating the object with radiation; wherein the top RDL is positioned above at least one lower RDL and above at least one dielectric layer; wherein the at least one dielectric layer significantly absorbs the radiation;
   generating, by a detector, detection signals that represent radiation reflected from the object; and
   processing, by a processor, the detection signal to provide information about the top RDL; wherein the processing comprises distinguishing detection signals related to the top RDL from detection signals related to the at least one lower RDL.

2. The method according to claim 1, wherein the distinguishing is based on a strength of the detection signals and wherein the detection signals related to the top RDL are stronger than the detection signals related to the at least one lower RDL.

3. The method according to claim 1, comprising determining a spectral range of the radiation based on at least one absorption property of the at least one dielectric layer of the object.

4. The method according to claim 3, wherein the at least one absorption property is an absorption spectrum of a dielectric material that forms the at least one dielectric layer of the object.

5. The method according to claim 3, wherein the at least one absorption property is a thickness of the at least one dielectric layer of the object.

6. The method according to claim 3, wherein the at least one absorption property is (a) an absorption spectrum of a dielectric material that forms the at least one dielectric layer of the object, and (b) a thickness of the at least one dielectric layer of the object.

7. The method according to claim 3, wherein the determining is based on testing the object with ultraviolet radiation of different spectral ranges and selecting a selected spectral range of the different spectral ranges.

8. The method according to claim 3, wherein the determining is based on estimating reflected ultraviolet radiation to be reflected from the object when illuminated with ultraviolet radiation of different spectral ranges and selecting a selected spectral range of the different spectral ranges.

9. The method according to claim 3, wherein the determining comprises selecting a filtering property of a filter located between an ultraviolet radiation source and the object.

10. The method according to claim 3, wherein the determining comprises selecting an ultraviolet source out of multiple ultraviolet sources.

11. The method according to claim 1 wherein the top RDL is positioned below a top dielectric layer.

12. A non-transitory computer readable medium that stores instructions for:
    illuminating the object with radiation; wherein the object comprise a top redistribution layer that RDL is positioned above at least one lower RDL and above at least one dielectric layer; wherein the at least one dielectric layer significantly absorbs the radiation;
    generating, by a detector, detection signals that represent radiation reflected from the object; and
    processing, by a processor, the detection signal to provide information about the top RDL; wherein the processing comprises distinguishing detection signals related to the top RDL from detection signals related to the at least one lower RDL.

13. The non-transitory computer readable medium according to claim 12, wherein the distinguishing is based on a strength of the detection signals and wherein the detection signals related to the top RDL are stronger than the detection signals related to the at least one lower RDL.

14. The non-transitory computer readable medium according to claim 12, that stores instructions for determining a spectral range of the radiation based on at least one absorption property of at least one dielectric layer of the object.

15. The non-transitory computer readable medium according to claim 14, wherein the at least one absorption property is an absorption spectrum of a dielectric material that forms the at least one dielectric layer of the object.

16. The non-transitory computer readable medium according to claim 14, wherein the at least one absorption property is a thickness of the at least one dielectric layer of the object.

17. The non-transitory computer readable medium according to claim 14, wherein the at least one absorption property is (a) an absorption spectrum of a dielectric material that forms the at least one dielectric layer of the object, and (b) a thickness of the at least one dielectric layer of the object.

18. The non-transitory computer readable medium according to claim 14, wherein the determining is based on testing the object with ultraviolet radiation of different spectral ranges and selecting a selected spectral range of the different spectral ranges.

19. A system for inspecting an object, the system comprises:
- an illumination module that is configured to illuminate an object with radiation, wherein a top redistribution layer (RDL) of the object is positioned above at least one lower RDL and above at least one dielectric layer;
- a detector that is configured to generate detection signals representing radiation reflected from the object; wherein the detection signals related to the top RDL are stronger than the detection signals related to the at least one lower RDL; wherein the at least one dielectric layer significantly absorbs the radiation; and
- a processor that is configured to process the detection signals to provide information about the top RDL, wherein the processor is configured to distinguish the detection signals related to the top RDL from the detection signals related to the at least one lower RDL.

20. The system according to claim 19, that is configured to determine a spectral range of the radiation based on at least one absorption property of at least one dielectric layer of the object.

* * * * *